(12) United States Patent
Frid et al.

(10) Patent No.: US 8,778,015 B2
(45) Date of Patent: Jul. 15, 2014

(54) INTERVENTIONAL MEDICAL DEVICE FOR USE IN MRI

(76) Inventors: Noureddine Frid, Beersel (BE);
Patricia Gruffaz, Frouard (FR)

( * ) Notice: Subject to any disclaimer, the term of this patent is extended or adjusted under 35 U.S.C. 154(b) by 525 days.

(21) Appl. No.: 11/817,662

(22) PCT Filed: Mar. 3, 2006

(86) PCT No.: PCT/EP2006/060442
§ 371 (c)(1),
(2), (4) Date: Apr. 23, 2008

(87) PCT Pub. No.: WO2006/094941
PCT Pub. Date: Sep. 14, 2006

(65) Prior Publication Data
US 2009/0054981 A1    Feb. 26, 2009

(30) Foreign Application Priority Data
Mar. 4, 2005    (EP) ................................... 05101696

(51) Int. Cl.
*A61F 2/06*    (2013.01)
(52) U.S. Cl.
USPC ............................ 623/1.46; 623/1.34; 623/1.2
(58) Field of Classification Search
USPC .................................................. 623/1.1–1.54
See application file for complete search history.

(56) References Cited

U.S. PATENT DOCUMENTS

| | | | | |
|---|---|---|---|---|
| 5,441,746 A | * | 8/1995 | Chagnon | 424/450 |
| 5,873,849 A | * | 2/1999 | Bernard | 604/20 |
| 6,174,326 B1 | * | 1/2001 | Kitaoka et al. | 623/1.15 |
| 6,174,329 B1 | * | 1/2001 | Callol et al. | 623/1.34 |
| 6,174,330 B1 | * | 1/2001 | Stinson | 623/1.34 |
| 6,290,726 B1 | * | 9/2001 | Pope et al. | 623/22.15 |
| 6,293,966 B1 | * | 9/2001 | Frantzen | 623/1.15 |
| 2002/0138136 A1 | * | 9/2002 | Chandresekaran et al. | 623/1.34 |
| 2002/0188314 A1 | * | 12/2002 | Anderson et al. | 606/200 |
| 2004/0153117 A1 | * | 8/2004 | Clubb et al. | 606/200 |
| 2005/0060021 A1 | * | 3/2005 | O'Brien et al. | 623/1.15 |
| 2005/0106212 A1 | * | 5/2005 | Gertner et al. | 424/425 |
| 2005/0107870 A1 | * | 5/2005 | Wang et al. | 623/1.44 |
| 2006/0149386 A1 | * | 7/2006 | Clarke et al. | 623/18.12 |

FOREIGN PATENT DOCUMENTS

WO    WO 0008220 A1 * 2/2000

OTHER PUBLICATIONS

O'Brien B, et al., Passivation of Nitinol Wire for Vascular Implants—A Demonstration of the Benefits, Biomaterial Apr. 15, 2002, United Kingdom, vol. 23, No. 9, pp. 1739-1748.

(Continued)

*Primary Examiner* — David Isabella
*Assistant Examiner* — Jacqueline Woznicki
(74) *Attorney, Agent, or Firm* — Leydig, Voit & Mayer, Ltd; Gerald T. Gray

(57) ABSTRACT

A medical device with metal parts to be introduced into animal or human bodies is rendered visible during RMN imaging by covering the exterior surface of the metal parts with a layer comprising Nickel monoxide. When placed within the electromagnetic field generated by a NMR apparatus, the layer reduces disturbances induced in this field in the vicinity of the metal part. This improvement is chiefly related to endoprostheses for subjects or patients who will be submitted to NMR imaging. In particular, the invention is aimed at luminal endoprostheses comprising a metal frame, as stents.

5 Claims, 5 Drawing Sheets

| AES spectra | A | B | C |
|---|---|---|---|
| % Titanium (surface) | 21 | 37 | 17,5 |
| % Nickel (surface) | 4,7 | 11,4 | 25,5 |
| Titanium/Nickel ratio | 4,5 | 3,3 | 0,7 |
| Thickness (nm) | 423 | 7,5 | 690 |
| Titanium metal/oxides | ~ 3 % | ~ 7 % | ~ 0 % |
| $TiO_2/Ti_xO_y+Ti$ | ~ 87 % | ~ 75 % | ~ 72 % |
| Nickel metal/Nickel oxides | ~ 15 % | ~ 62 % | ~ 0 % |

(56) References Cited

OTHER PUBLICATIONS

Carroll W. M. et al., Corrosion Behavior of Nitinol Wires in Body Fluids Environments, Journal of Biomedical Materials Research—Part A, Dec. 15, 2003, United States, vol. 67, No. 4, pp. 1123-1130.

Anonymous, Ethylene Oxide (internet artice), Jun. 24, 2004, http://www.isotron.com/html/pro_ebi.htm, retrieved Jun. 10, 2005.

Shabalovskaya S A., Surface, Corrosion and Biocompativility Aspects of Nitinol as an Implant Material, Bio-medical Materials and Engineering 2002, Netherlands, vol. 12, No. 1, pp. 69-109.

Van Holten J et al., High Flip Angle Imaging of Metallic Stents: Implications for MR Angiography and Intraluminal Signal Interpretation, Magnetic Resonance in Medicine, Oct. 1, 2003, United States, vol. 50, No. 4, pp. 879-883.

Wang Y et al., Quantitative Evaluation of Susceptibility and Shielding Effects of Nintinol, Platinum, Cobalt-Alloy, and Stainless Steel Stents, Magnetic Resonance in Medicine May 1, 2003, United States, vol. 49, No. 5, pp. 972-976.

The International Search Report dated Jun. 6, 2006.

* cited by examiner

FIG. 5

| AES spectra | A | B | C |
|---|---|---|---|
| % Titanium (surface) | 21 | 37 | 17,5 |
| % Nickel (surface) | 4,7 | 11,4 | 25,5 |
| Titanium/Nickel ratio | 4,5 | 3,3 | 0,7 |
| Thickness (nm) | 423 | 7,5 | 690 |
| Titanium metal/oxides | ~ 3 % | ~ 7 % | ~ 0 % |
| $TiO_2/Ti_xO_y$+Ti | ~ 87 % | ~ 75 % | ~ 72 % |
| Nickel metal/Nickel oxides | ~ 15 % | ~ 62 % | ~ 0 % |

INTERVENTIONAL MEDICAL DEVICE FOR USE IN MRI

FIELD OF THE INVENTION

The invention relates to medical devices with metal parts to be introduced into animal or human bodies. The invention is particularly adapted to endoprostheses, and i.a. to luminal endoprostheses.

DESCRIPTION OF PRIOR ART

The invention is generally related to the possibility of submitting subjects or patients bearing such endoprostheses to NMR imaging. The invention is also related to the possibility for interventional Radiologists or other praticians to exert a permanent control on the progress of internal operations implying the use of catheters or other medical devices with the supervision of NMR imaging.

The perfecting of imaging processes has caused important progresses in medicine.

Introducing devices with metal parts into the human body however brought about unexpected problems. When the body is submitted to electromagnetic fields of given frequency (as e.g. generated by a microwave oven) the metal parts could react and, in the case of heart pacemakers, lead to malfunctions.

NMR imaging is the biomedical application of the Nuclear Magnetic Resonance. It allows making visible tissues and blood vessels. The protons of the water they contain resonate under the influence of magnetic fields and emit a signal. An image can be build up from this signal.

The presence of devices comprising metal parts (though defined as NMR compatible) not only disturbs the image obtained during the NMR examination but make it impossible to observe body parts in the vicinity of said devices. This problem is of course crucial during the placement of very small endoprostheses, as stents.

The problem that arises is not, as could be expected, the rise of temperature in a metallic part submitted to a strong magnetic field (though burns have been reported with conductive devices improperly used), but the distortion of the image caused by a local disruption of the local magnetic field. This perturbs the relationship between position and frequency, a factor of crucial importance for proper image reconstruction.

This means that the patient must be submitted to potentially dangerous X-ray examination. One notes that in the case of luminal endoprostheses, even X-ray examination will not be able to determine e.g. which tissues blocks a vessel, a problem that frequently arises with stents. Another, more general major problem that arises in endoprostheses is the fact that an endoprosthesis is considered by the organism as an invading body and subjected to strong chemical attacks, possibly leading to the release of noxious substances. The compatibility of the components with the conditions prevailing inside the body (bio-compatibility) must thus also be taken into account.

Metal parts of endoprostheses are submitted to these attacks as well as other materials. It is thus compulsory to make use e.g. of noble metals, with a high-grade surface finish.

Some kinds of alloy (as stainless steel or Nitinol) containing toxic heavy metals (Nickel, chromium) are at the origin of specific problems, leading to the necessity of completing the external finish of metal parts by compatible protective layers.

Nitinol is increasingly used i.a. in the manufacturing of luminal endoprostheses, e.g. for blood vessels, oesophageal stents, urethral catheters and so on. The presence of Nickel in metal form at the surface of such alloys led to the general requirement of a chemical polishing of these parts, generally associated with the laying of a protective surface covering.

O'Brien, Carroll WW and Kelly et al, in "*Passivation of Nitinol wire for vascular implants—a demonstration of the benefits*", (BIOMATERIALS 15 Apr. 2002) (referred to hereafter as D1) investigate a passivation process for polished Nitinol. The study concludes that after its passivation treatment, which increases on the surface the bulk of $TiO_2$, Nickel is still released, though the amount of Nickel released decreases with time. Obviously, this method of passivation does not solve the problem of bio-compatibility of Nitinol-containing medical devices.

The same authors, namely Carroll WW and Kelly in "*Corrosion behaviour of Nitinol wires in body fluid environment*" (JOURNAL OF BIOMEDICAL MATERIALS RESEARCH Part A, 15 Dec. 2003)) (referred to hereafter as D2) study breakdown potentials of polished and unpolished Nitinol wires in simulated body fluids. They do not make any difference between $Ni_2O_3$ and $NiO$. Their conclusion is of course that small amounts of Nickel are still released in body fluid.

SHABALOVSKAYA S, in "Surface, corrosion and biocompatibility aspects of Nitinol as an implant material" (BIOMEDICAL MATERIALS AND ENGINEERING, vol 12, n° 1, 2002) (referred to hereafter as D4) complaints about the tremendous variations in corrosion performances of Nitinol sold by various vendors.

VAN HOLTEN j et al. In "*High flip angle imaging of metallic stents: Implication for MR angiography and intraluminal signal interpretation*" (MAGNETIC RESONANCE IN MEDECINE, 1 Oct. 2003)) (referred to hereafter as D5), having completed a search on the effect of the flip angle on the rendering of imaging of various in situ stents, concludes on the superiority of ABI alloys with respect to Nitinol. They also suggest that the geometry of the stent could be responsible of a dispersion of her results for Nitinol stents. They nowhere suggest that the state of oxidization of the samples may be responsible of a difference in the results.

None of the cited prior art does make a relationship between the NMR imaging results and the oxidization state of the metal.

SUMMARY OF THE INVENTION

The object of the invention is to provide medical devices and/or metal components for such medical devices that would not generate disturbances during operations implying oscillating electromagnetic field, in particular during NMR imaging tests.

Another object of the invention is to provide medical devices, and especially endoprostheses, that would prove not armful for the user.

The subject of the invention is a medical interventional device comprising at least one metal part. At least one exterior surface of the at least one metal part is covered by a layer of oxidized Nickel, wherein all the Nickel is oxidized in Nickel monoxide (NiO); when the device is placed the field generated by a Nuclear Magnetic Resonance generator, said layer eliminates, due to its anti ferromagnetic properties, the distortion of the image caused by a local disruption of the magnetic field in the vicinity of said metal part, thus making this device visible in NMR imaging.

The at least one metal part is advantageously made of a Nickel alloy as Nitinol, what allows the possibility of generating the Nickel monoxide layer directly from the metal.

According to a preferred embodiment, the medical interventional device is a luminal endoprosthesis. However, the man skilled in the art will understand that it could be as well apply to any of the following medical devices: biopsy needles, markers and such devices; breast tissue expanders and implants; cardiovascular catheters and accessories; carotid artery vascular clamps; coils, stents and filters; dental implants, devices and materials; ECG electrodes; foley catheter with temperature sensors; halo vests and cervical fixation devices; heart valve prostheses and annuloplasty rings; hemostatic clips; ocular implant and devices; orthopaedic implants, materials and devices; otologic implants; patent ductus arteriosus (PDA), atrial septal defect (ASD) and ventricular septal defect (VSD) occluders; pellets and bullets; penile implants; vascular access ports, infusion pumps and catheters and so on.

According to an advantageous embodiment, the at least one metal part of the endoprosthesis has the shape of a bundle of wires, which is preferably braided, enhancing the mechanical properties of the prosthesis.

Another subject of the invention is a method for obtaining a NMR visible interventional medical device comprising the following operations:

selecting a Nitinol alloy;

manufacturing a metal part of said alloy;

preserving the external oxidized layer resulting from the manufacturing of said part;

heating said part at about 500° C. in air during at least 10 minutes.

placing said part in an ethylene oxide atmosphere saturated with water during a given time inducing a reaction converting all the Nickel and Nickel oxides present in the external layer into anti ferromagnetic Nickel monoxide An advantage of this method is that the external layer of raw Nitinol oxidizes, thus producing in a first step $Ni_xO_y$, that are then converted into NiO. These steps further are included in the manufacture process of the medical device, saving time and costs (placing medical devices in an ethylene oxide atmosphere saturated with water is a known sterilization process, but it had never been suggested to alter the surface composition of the sterilized item).

During the last step, the protective layer grows thicker and the endoprostheses is sterilised, which also spares a manufacturing operation. Raw oxidized Nitinol producing i.a. $Ni_2O_3$, the latter is further completely converted into NiO by the ethylene oxide, thus achieving the searched effect.

BRIEF DESCRIPTION OF THE DRAWINGS

Other specific features and advantages of the invention will become apparent from the description hereinafter, of particular embodiments of the invention given as examples, reference being made to the appended drawings in which

FIG. 5 is a table summarising analysis result of surface layers.

DETAILED DESCRIPTION OF THE DRAWINGS

Figure 1:
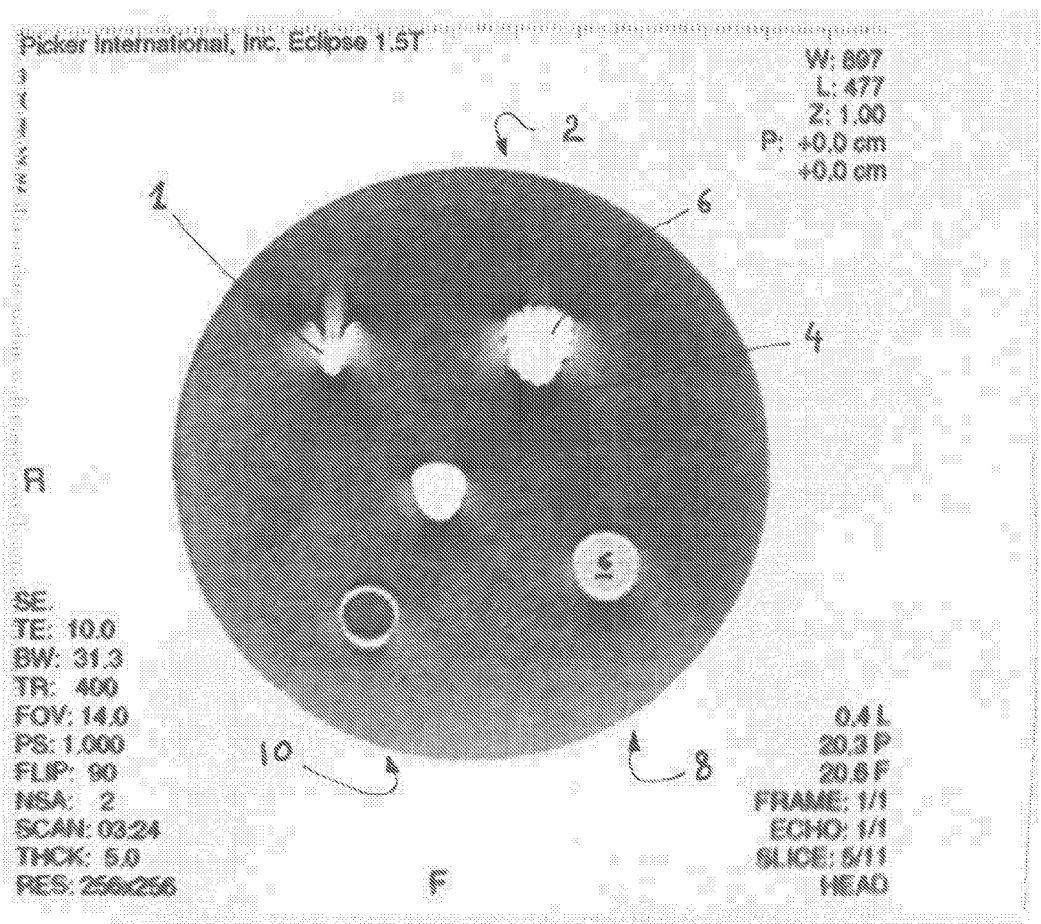
FIG. 1 is an inverted RMN image of various examples of luminal endoprostheses, seen in cross-section.

FIG. 1 is the inverted (negative) image of various kinds of luminal endoprostheses placed in a RMN imaging system. To compensate the relatively poor quality of the reproduction, this image is completed by sketches, commented hereinafter.

FIG. 1 displays the cross-section of a conventional (stainless steel) braided stent 1 as seen in NMR imaging. The tissues extending around the stent appear in various tones of grey, as in a normal image.

No image of the stainless steel stent 1 or of the surrounding tissues can be seen at all: only an artefact in the shape of a fleur-de-lis appears on the screen.

Figure 2:
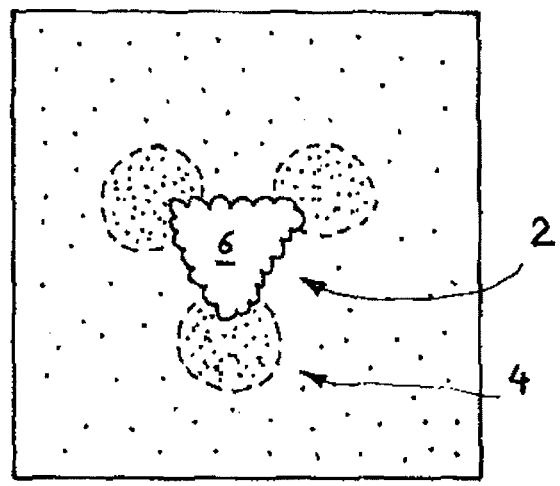
FIG. 2 is a detailed sketch of the image obtained at FIG. 1 of a cross-section of a conventional (stainless steel) luminal endoprosthesis.

FIG. 2 shows more in detail the image of a conventional stent 2 obtained by laser-cutting a Nitinol tube. The stent 2 comprises a metal framework that also reacts in the presence of the strong magnetic field (in the order of 1 Tesla) generated for this test. As a consequence, stent 2 also provokes disturbances and artefacts in the NMR image: the circular cross-section of the stent is strongly distorted, appearing on the screen as heart-shaped, with "sparks" 4 near each point. Strongly contrasting with the grey surrounding, the inner volume 6 of the stent appears in strong white, indicating that in this area the field does not activate the water molecules.

This phenomenon prohibits, for prior art stents, the use of NMR imaging to check the state of the vessels inside the stents and requires a special skill of the operator.

Figure 3:
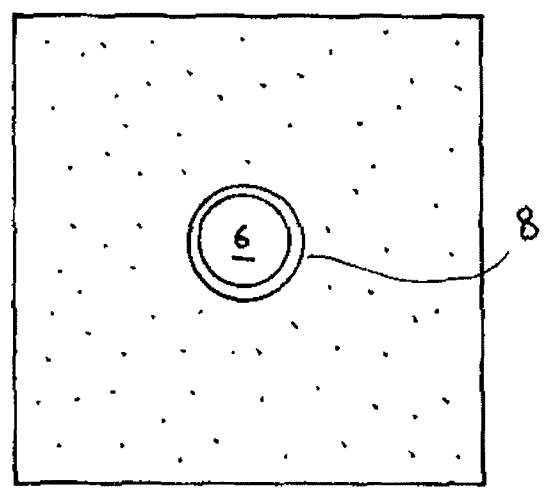
FIG. 3 is the image obtained in the same circumstances of a conventional Nitinol endoprosthesis.

FIG. 3 is the cross-section obtained with a prior art Nitinol braided stent 8 in the same circumstances.

Though the cross-section is less distorted, the stent and its inside volume 6 still appear as a plain white spot.

Figure 4:
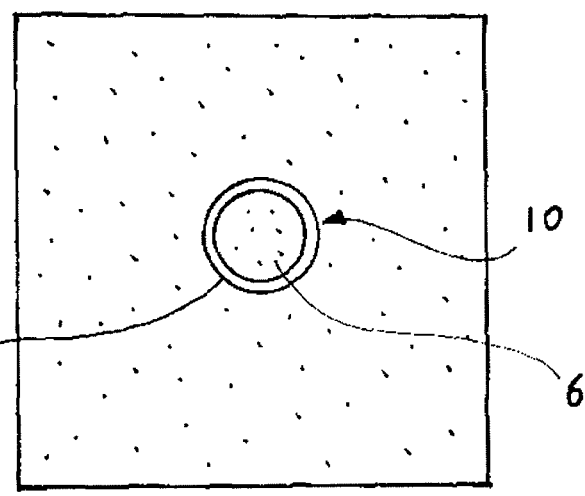
FIG. 4 is the image obtained in the same circumstances of a luminal endoprosthesis of the invention.

FIG. 4 is the cross-section obtained with a stent of the present invention 10 in the same circumstances.

The wall 12 of the stent itself appears as a white, distinct circle.

The colour of the area 6 delimited by the stent 10 is the same as this of the surrounding tissues. The operator is thus able to check whether a possible clogging has developed inside the stent, the aspect of the vessel walls, etc.

It must be underlined that all the samples were placed in an identical position and according to the same flip angle, contrary to the experiment carried in D5.

This effect, discovered unexpectedly, opens huge possibilities in various medical fields, and nor only in the field of endoprostheses, but also whenever any kind of metal medical devices is used in conjunction with RMN imaging.

Long and careful studies and searches (as demonstrated by D5) had to be carried out before at least some explanations could be given of this phenomenon. It seems that, though there was a relationship, it was neither the nature of the metal itself, nor its geometry (as explained in D5) that caused this result (as is demonstrated by FIGS. 2 and 3), but rather the composition of its surface. Indeed, in an unexpected manner, the classical chemical polishing to which Nitinol stent are subjected removed this effect, giving NMR images close to FIG. 3.

A subsequent oxidation of polished stents did not re-establish the above properties.

It was thus compulsory to study layer by layer the properties and the composition of the superficial film (about 500 nm) surrounding each metal part.

It seemed obvious from the distinct bluish colour of the non-polished metal, and from the high oxidation degree of Titanium, that Titanium-oxide (also known as an insulator or semi-conductor) was at the origin of the beneficial effect that had been discovered. Furthermore, TixOy would constitute a barrier against contact between the body fluids and Nickel, also present in Nitinol alloys, Disappointingly, this assumption was wrong, and on the contrary, an important amount of Nickel was found in the layers of the external film. This is confirmed by the article of O'Brien & al (D1). However, D1 states unambiguously that Nitinol passivated according to his method still releases Nickel. This proves impossible, because NiO is a stable oxide. Hence, when D1 refers to Nickel oxide (and specifically to so-called NiO), we must conclude that it in reality refers to various kinds of Ni oxides, implying especially to reactive $Ni_2O_3$.

Unexpectedly, again, it could be established that it was the Nickel (under the form of Nickel monoxide) that was at the base of the advantageous property.

The known antiferromagnetic nature of NiO seems the main cause of the "transparency" of the studied endoprostheses, though the mechanism is not, at the present time, totally understood.

The role of other components of the external film not clearly established; the presence of Titanium oxides could probably be related to the bio-compatibility of the stent.

Anyway, a reproducible method for obtaining a layer of the required property was elaborated.

This method is based on the elaboration of the required protective layer during the manufacturing process of the endoprosthesis itself.

A Nitinol alloy comprising preferably between 52 and 56% by weight of Nickel is selected. The above compositions allow to set by adequate thermal treatment a phase transition in the metal.

The metal part is then put into shape according to usual state of the art manners. For an endoprosthesis comprising a braided framework, the metal is wiredrawn, then braided in its "raw" (rough and oxidized) state. During the various operations, one takes care to preserve the oxidized external layer of the metal parts.

When in shape, the metal parts are heated at about 500° C. in open air. During this step, the exact temperature at which the metal will undergo a metallic phase transition is set. Simultaneously, the Nickel remaining in its metal form at the surface of the metal is almost completely oxidized to form $Ni_xO_y$, and i.a. $Ni_2O_3$ and NiO that will confer upon the metal part the magnetic "non-perturbating" properties that were sought.

Tests showed that surprisingly some endoprostheses having undergone the above process gave systematically better results than the average samples.

A relation was made between the improved results and a particular sterilization method used for these samples.

Analysis confirmed that placing the metal parts for two hours in an ethylene oxide atmosphere (in the presence of water) substantially increases the thickness of the oxide layer and causes the last metal Nickel and $Ni_2O_3$ to be converted into Nickel monoxide. Indeed, ethylene oxide reacts with water to form ethylene glycol, the latter, having acid properties, reacts specifically with $Ni_2O_3$ to produce NiO. Such an effect is neither described, nor suggested by O'Brien & al.

The reactions can be summarized as follows:

$$Ni + H_2O \longrightarrow NiO + 2H^+ + 2e^-$$

-continued

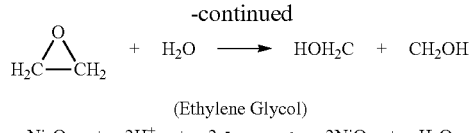

(Ethylene Glycol)

$$Ni_2O_3 + 2H^+ + 2e^- \longrightarrow 2NiO + H_2O$$

Integrating this particular step in the manufacture process of an endoprosthesis of the invention thus brings about three advantages:
- the "visibility" of the surrounding tissues is enhanced;
- the endoprosthesis is simultaneously completely sterilized;
- the endoprosthesis can be submitted to the action of ethylene oxide when already packed-up. In the case of a stent, the stent can even be placed inside its release catheter.

FIG. 5 is a table showing the composition (established by AES and X-ray spectroscopy) of the surface of samples of Nitinol endoprostheses having undergone various treatments. A-samples were "raw", i.e. the metal was as received from the wire factory; B-samples were "cleaned", i.e. their external layer had been removed by (chemical) polishing; C-samples had undergone the process described above.

Surface and depth profile analyses of the Nitinol wires revealed various surface composition, contamination and oxide layer composition/thickness.

The concentration of both Nickel and Titanium on the surface, the main ratio Ti/Ni and the main oxide thickness in nm for each tested sample is presented in the Table of FIG. 5.

AES spectra of "raw" A-sample indicated mainly surface contamination by carbon and to a lesser extent, by other components as Si, P and S. A low amount of Nickel was observed on the analysed surface corresponding to a Ti/Ni ratio=4.5. The oxide thickness was estimated to be about 380 nm. The surfaces were quite rough and inhomogeneous in topography as observed by secondary electrons.

"Cleaned" B-samples presented relatively uniform surface chemical compositions with low surface contamination, mainly carbon. These samples were characterized by higher Nickel concentration in comparison to raw materials corresponding to a Ti/Ni ratio=3.3±0.5. The depth profile indicated a Titanium rich thin oxide layer thickness of 7.5±0.69 nm. The surface topography was relatively rough and similar to that of "raw" samples.

The AES analyses of "finished" C-samples indicated significant modifications for both surface composition and oxide thickness in comparison to "raw" and "cleaned" samples. Surface contamination was identified to be mainly Carbon, and traces of P and S. The lower Ti/Ni ratio (about =0.7) of the surface-finished samples indicated a higher Ni concentration on these surfaces comparatively to the others. The depth profile analysis revealed that the surface was composed of at least three (3) distinct layers. The first layer (0 to 10-40 nm of depth) is characterized by relatively high amount of Nickel in the form of Nickel oxide. This thin layer is followed by a Titanium oxide enriched thicker layer (10-40 nm to 140 nm depth). Samples of this series showed a regular decrease in the oxygen concentration as a function of depth that can be related to the transition between Titanium rich oxide layer and the bulk material. However, one of the tested samples presented a transition layer corresponding to a locally increased of oxygen concentration in the range of 900 nm. Despite the irregularity in the oxide layer, the mean thickness for "finished" samples was estimated about 690.9±494.1 nm.

Ti/Ni ratio from XPS analysis of "raw", "cleaned" and "finished" samples confirmed the trends obtained from AES surface analyses. Indeed XPS showed that "finished" samples presented a Nickel enriched surface (Ti/Ni=1.4) when compared to "raw" (Ti/Ni=12.5) and to "cleaned" (Ti/Ni=7.1) samples. The difference between AES and XPS in the quantification of the surface components can be explained by the difference in depth analysis and sensibility of these techniques (AES is more accurate to characterize the most outer surface area than XPS).

When considering the chemical composition, XPS analyses were able to identify the nature of the oxide surface on Nitinol wires. Depending on the oxidation conditions (Temperature, Oxygen concentration, Pressure, . . . ), the surface chemistry of the alloy is dramatically modified. The latter can be related to the free energy formation of Nickel and Titanium oxides ($-50.6$ kcal mol$^{-1}$ for NiO, $-118.3$ kcal mol$^{-1}$ for TiO and $-212.6$ kcal mol$^{-1}$ for TiO$_2$). In general, NiTi surfaces tend to be covered by TiO$_2$ in presence of oxygen because of high oxidation degree of Titanium, and Nickel is expected to be in the metallic and/or oxidized state (mainly NiO or Ni2O3).

"Raw" samples presented Titanium rich surfaces as compared with other samples. XPS analyses of Titanium spectra revealed that the surface was mainly covered by TiO$_2$ (about 85 of the Ti signal) with a small amount of Ti$_2$O$_3$. A Very small amount of metallic Titanium was detected on the surface. Nickel XPS spectra indicated that Nickel was mostly oxidized (~85%) while about 15% of the Nickel was in the metallic state.

"Cleaned" B-samples also presented a TiO$_2$ rich surface layer (~75% TiO$_2$ on the surface). Only small amounts of other Titanium oxides and metallic Titanium (~7%) were detected. In contrast to "raw" A-samples, Nickel XPS spectra of "Cleaned" B-samples indicated that Nickel was predominantly in the metallic state (~62% for metallic Nickel versus 38% for Nickel oxides).

XPS spectra showed that Nickel was completely oxidized on "finished" C-samples. As previously mentioned, the oxidized state of Nickel and Titanium on "finished" samples can be explained by the specific oxidation conditions that allowed their complete oxidation during the surface treatment.

Figure 6:
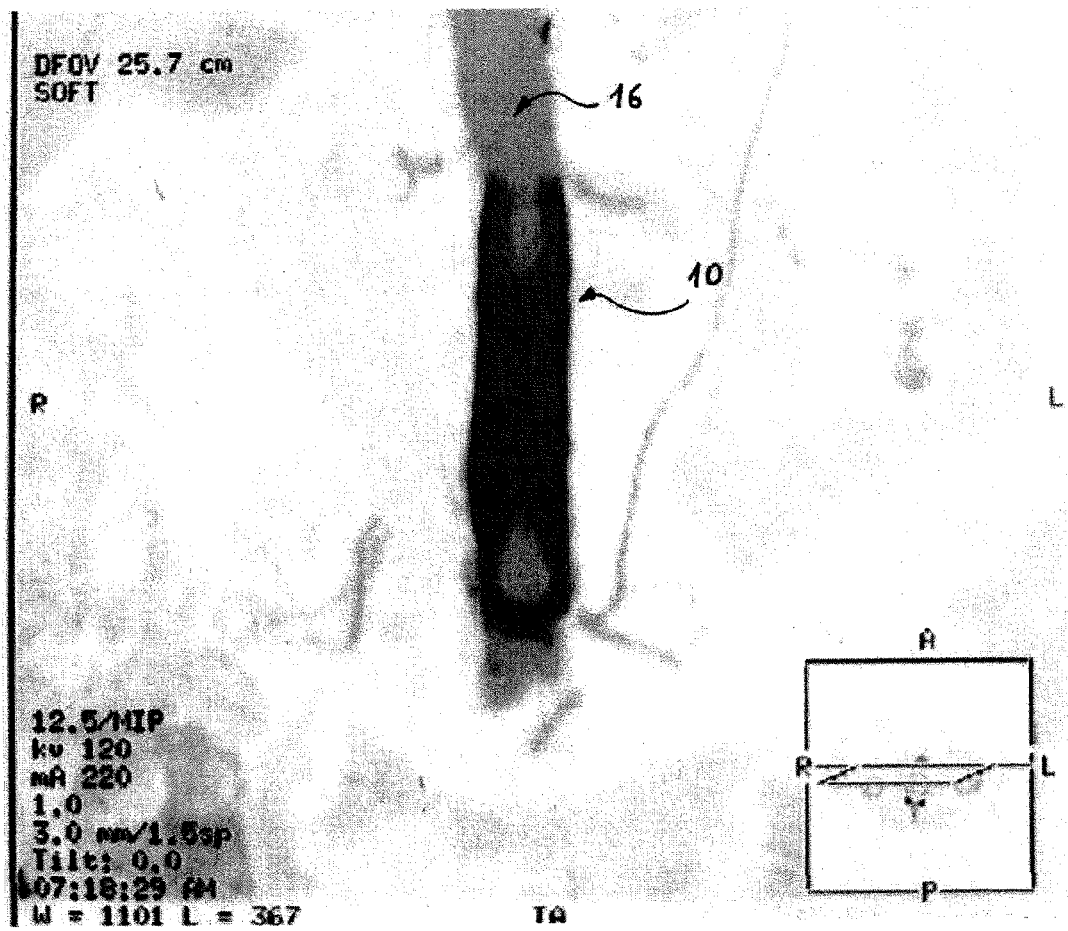
FIGS. 6 and 7 are lateral view in inverted NMR imaging of the luminal endoprostheses of FIG. 4, respectively in elevation and in lateral cross-section.

FIG. 6 is a lateral view in NMR imaging of the stent 10 of FIG. 4, i.e. made according to the invention.

This stent is made of braided metal wires. As can be seen on FIG. 6, the braiding of the wires of the claimed stent 10 is visible on the screen, a result that cannot be obtained for any known endoprosthesis presently on the market.

Figure 7:
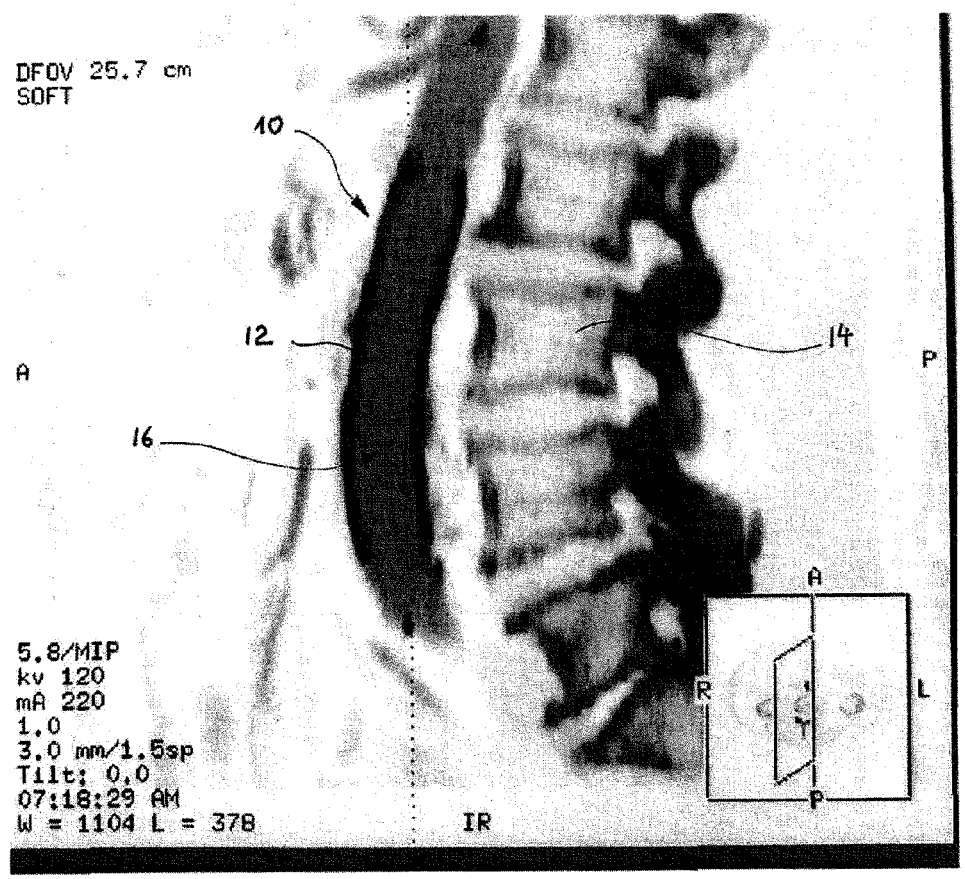

FIG. 7 is a view in cross-section of the same stent 10. Such an image would be considered as paradoxical with any kind of state-of-the-art stent. The spine 14 is clearly visible on the image. The stent according to the invention is depicted as a double line extending along the arterial wall, while the inside of the vessel 16 is free of any artefact.

Though the above examples are chosen in the luminal endoprosthesis technology, it is obvious for the man skilled in the art that the method of the invention can be applied to other metal devices that must be inserted into a human body.

Further, other methods as e.g. cathode sputtering can be used to put a protective layer of Nickel oxide (and/or a mixture of Nickel and Titanium oxide) on various kinds of metal used for the same purpose.

What is claimed:

1. A stent made of Nitinol having an exterior surface, wherein the entire exterior surface is covered by a layer consisting of Nickel monoxide (NiO).

2. The stent according to claim 1, wherein the stent has the shape of a bundle of wires.

3. The stent according to claim 2, wherein the wires are braided.

4. A metal endoprothesis, comprising metal parts made of Nitinol having exterior surfaces wherein the entire exterior surfaces of the metal parts are covered by a layer consisting of Nickel monoxide (NiO), wherein the metal parts have the shape of a bundle of wires.

5. The metal endoprothesis according to claim 4, wherein the wires are braided.

* * * * *